United States Patent [19]

Mijuskovic

[11] Patent Number: 5,079,514

[45] Date of Patent: Jan. 7, 1992

[54] COMPENSATION CIRCUIT AND METHOD FOR STABILIZING AN OPERATIONAL AMPLIFIER

[75] Inventor: Dejan Mijuskovic, Chandler, Ariz.

[73] Assignee: Motorola Inc., Schaumburg, Ill.

[21] Appl. No.: 592,006

[22] Filed: Oct. 1, 1990

[51] Int. Cl.[5] ............................ H03F 3/45; H03F 3/16
[52] U.S. Cl. .................................... 330/253; 330/301; 330/292
[58] Field of Search ................ 330/252, 253, 277, 292, 330/294, 301, 311, 107, 109, 302

[56] References Cited

U.S. PATENT DOCUMENTS 4,524,327  6/1985  Masuda et al. ...................... 330/253

Primary Examiner—Steven Mottola
Attorney, Agent, or Firm—Robert D. Atkins

[57] ABSTRACT

An operational amplifier is provided with an improved frequency compensation circuit, wherein a first compensation circuit inserts a first dominant pole at a first predetermined frequency for decreasing the magnitude of the ouput signal of the operational amplifier with increasing frequency, while a second compensation circuit inserts a pole and a zero at second and third predetermined higher frequencies in the transfer function of the operational amplifier, respectively, for stabilizing the first compensation circuit and ensuring the stability of the operational amplifier over the operational bandwidth. The pole and zero of the second compensation circuit inserts a positive phase shift about the third predetermined frequency effectively extending the phase response of the operational amplifier and allowing the frequency of the first dominant pole to be increased without sacrificing phase and gain margin. The higher frequency of the dominate pole provided by the first compensation circuit increases the gain-bandwidth product of the operational amplifier thereby improving its overall performance.

20 Claims, 4 Drawing Sheets

COMPENSATION CIRCUIT AND METHOD FOR STABILIZING AN OPERATIONAL AMPLIFIER

FIELD OF THE INVENTION

The present invention relates in general to operational amplifiers and, more particularly, to a compensation circuit and method for improving the stability of an operational amplifier.

BACKGROUND OF THE INVENTION

Operational amplifiers (op amps) are well enough known in the art as high gain devices for providing an output signal in response to a differential input signal. It is desirable for the op amp to have a high gain-bandwidth product for providing satisfactory operation over a wide band of frequencies. Since the gain-bandwidth product of the op amp remains substantially constant at any given point of operation, a higher feedback loop gain generally reduces the operational bandwidth while a higher operational bandwidth requires a smaller feedback loop gain to avoid oscillations, as is well understood. Although the feature of high gain alone is not difficult to achieve, the op amp must also maintain stable operation over the specified bandwidth. Thus, there is a tradeoff between offering a wide operational bandwidth and having high gain for the op amp with stability over the entire frequency range being of paramount concern.

Two generally accepted criteria for judging the degree of stability of the op amp are the phase margin and gain margin which may be read from a Bode plot diagram of the magnitude of the gain and the phase versus radian frequency $\omega$. The phase margin is the difference between 360° (degrees) and the phase response of the transfer function at the radian frequency corresponding to 0 dB (decibels) of the gain response, and the gain margin is the difference between 0 dB and the gain across the op amp at the critical frequency corresponding to 360° of the phase response. For all frequencies at which the gain is greater than one (0 dB), it is important to have less than 360° of phase shift through the amplifier; otherwise, when the output of the op amp is coupled back to its input by some impedance network, for example in an active filter application, the output signal could feedback in-phase with the input signal thereby permitting the op amp to sustain its own operation and oscillate.

The transfer function of an uncompensated op amp plotted as the gain versus radian frequency $\omega$ naturally rolls off at some high frequency as the components thereof reach an operational limit. However, such uncompensated op amps typically possess unacceptable gain and phase margins as one or more frequencies of operation pass through 360° of phase shift with an open loop gain greater than 0 dB, leaving the op amp exposed to possible oscillations. Consequently, most op amps are compensated with a dominate pole inserted at a predetermined low frequency to ensure that the transfer function rolls off at say 6 dB per octave in frequency and drops below 0 dB before the phase response reaches 360°. Earlier versions of op amps provided external ports at which a capacitor could be coupled for providing the dominate pole. More recently, op amps have been internally compensated, for example, with a capacitor feedback circuit matched to the particular characteristics of the op amp for maximizing the gain-bandwidth product. The value selection of the compensating capacitor and the predetermined low frequency of the dominate pole is important in determining the performance of the op amp. The frequency of the dominate pole should be made as high as possible for providing a good bandwidth, yet a higher frequency selection extends the roll-off frequency (first break point of the transfer function) and the unity gain frequency (0 dB crossing) thereby lowering the gain and phase margin. If the frequency of the dominate pole is selected too high such that component variation in the manufacturing process could allow the frequency of the dominate pole to drift even higher, the phase response may pass through 360° before the gain response falls below 0 dB and the op amp may operate in an unstable condition.

Occasionally, a double pole is inserted at the predetermined low frequency for providing an even steeper roll-off of the gain response, say 12 dB/octave, which might seem to offer a higher roll-off frequency without increasing the unity gain frequency and providing a wider bandwidth. However, the double poles also inserts a 180° shift causing the phase response to approach the critical 360° at a lower frequency as compared to a single pole response, possibly creating an unacceptable phase margin and again leaving the op amp susceptible to oscillation thereby defeating the purpose of the double pole. Thus, most op amp designers opt for the first alternative of only a single dominate pole for the internal frequency compensation circuit with sufficient guard band in the gain and phase margins to allow for component variation in the manufacturing process and accept the associated limitation on the gain-bandwidth product.

Hence, what is needed is an improved frequency compensation circuit for op amps which allows the dominate pole to be located at a higher frequency for increasing the gain-bandwidth product while ensuring the stability of the op amp over the operational bandwidth.

SUMMARY OF THE INVENTION

Accordingly, an object of the present invention is to provide an improved operational amplifier.

Another object of the present invention is to provide an op amp having an improved frequency compensation circuit.

Yet another object of the present invention is to provide an improved op amp having a first compensation circuit with a first dominant pole at a first frequency for providing an improved gain-bandwidth product.

Still another object of the present invention is to provide an improved op amp having a second compensation circuit operating within the loop of the first compensating circuit for establishing a second pole and a zero at predetermined higher frequencies for inserting a positive phase shift thereabout which increases the phase margin of the first compensation circuit and ensures the stability of the op amp over the operational bandwidth.

In accordance with the above and other objects there is provided an operational amplifier having first and second inputs coupled for receiving a differential input signal and having an output for providing an output signal inverted with respect to the differential input signal, comprising an input stage responsive to the differential input signal and having first and second outputs for conducting first and second differential currents. A differential to single-ended converter is provided having first and second inputs coupled for receiving the first and second differential currents and providing an output signal at a first node, wherein the first node is separated from the first input of the differential to single-ended converter by a high impedance. An output stage is coupled between the first node and the output of the operational amplifier and includes a first transistor having a drain coupled to the output of the operational amplifier, a source coupled to a first source of operating potential and a gate coupled for receiving the output signal of the differential to single-ended converter. The output stage further includes a first compensation circuit coupled between the output of the operational amplifier and the first input of the differential to single-ended converter for establishing a first pole in the transfer function of the operational amplifier at a first predetermined frequency, while a second compensation circuit is coupled between the output of the operational amplifier and the gate of the first transistor for establishing a second pole and a zero in the transfer function of the operational amplifier at second and third predetermined frequencies for inserting a positive phase shift about the third predetermined frequency which increases the phase margin of the operational amplifier.

In another aspect, the present invention is a method of stabilizing an operational amplifier, comprising the steps of receiving a differential input signal and converting the differential input signal to an output signal at a first node. The output signal is applied to the gate of a first transistor for providing an inverted output signal of the operational amplifier at the drain thereof. A first pole is established in the transfer function of the operational amplifier at a first predetermined frequency to decrease the magnitude of the inverted output signal of the operational amplifier with increasing frequency, and a second pole and a zero are established in the transfer function of the operational amplifier at second and third predetermined frequencies respectively for inserting a positive phase shift about the third predetermined frequency which allows the first predetermined frequency to be increased without extending the unity gain frequency of the operational amplifier above the frequency corresponding to a 360 degree phase shift through the operational amplifier.

DETAILED DESCRIPTION OF THE PRIOR ART

Figure 1:
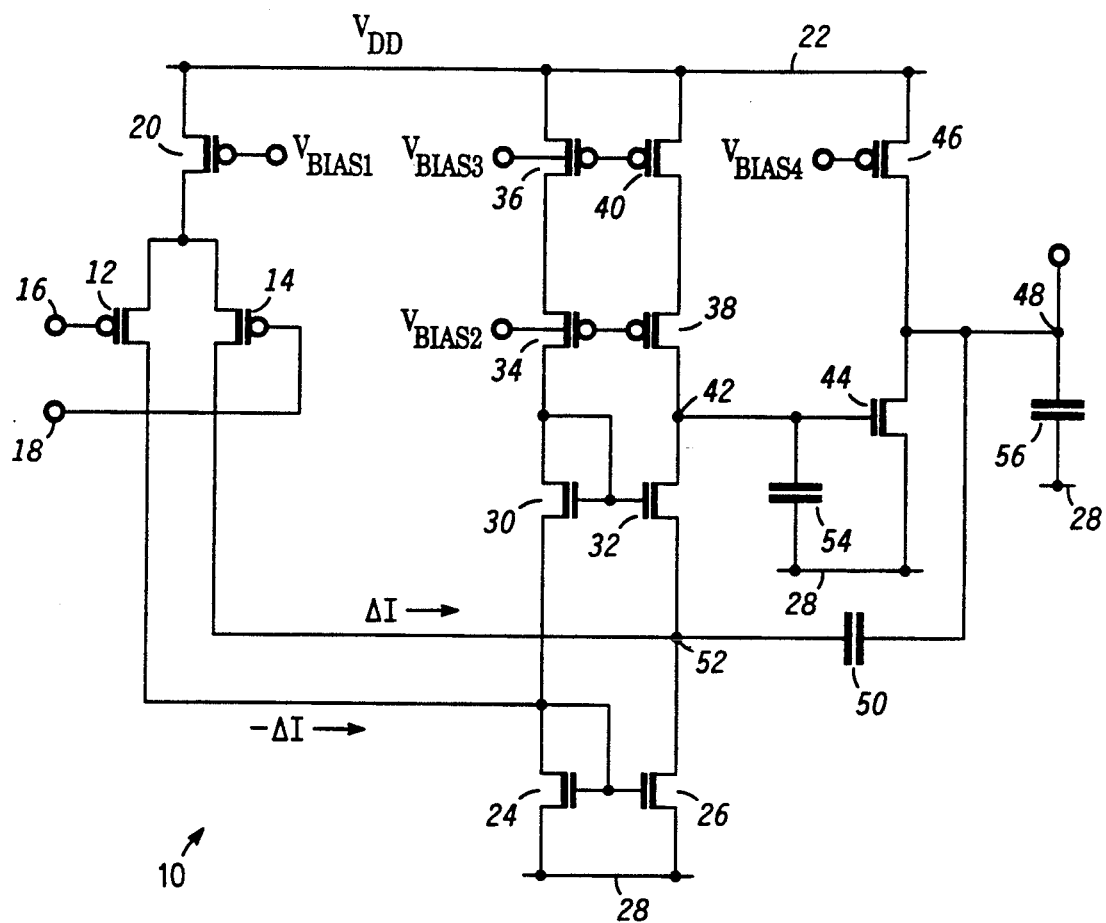
FIG. 1 is a schematic diagram illustrating a conventional compensation circuit for an operational amplifier.

A conventional op amp 10 is shown in FIG. 1 as prior art including balanced differential transistors 12 and 14 having gates coupled for receiving a differential input signal applied at input terminals 16 and 18, respectively, and common source terminals coupled to the drain of transistor 20, the latter of which operates as a current supply with its source coupled to power supply conductor 22 and gate responsive to bias potential $V_{BIAS1}$ for supplying a predetermined current to transistors 12 and 14. The sources of transistors 12 and 14 are respectively coupled to the input and output of a current mirror circuit formed of transistors 24 and 26 each having common gates and common sources coupled to power supply conductor 28 typically operating at ground potential. Transistors 30 and 32 form a second current mirror circuit cascoded with respect to current mirror transistors 24 and 26. The drain of transistor 30 is coupled to the common gates of transistors 30 and 32 and to cascode current source transistors 34 and 36, while the drain of transistor 32 is coupled for receiving the current supplied by cascode current source transistors 38 and 40. Current mirror transistors 30 and 32 are cascoded with transistors 24 and 26 for providing a high impedance at node 42, that is the drain of transistor 32.

Continuing with FIG. 1, the gates of transistors 34 and 38 are coupled for receiving bias potential $V_{BIAS2}$, and the gates of transistors 36 and 40 are coupled for receiving bias potential $V_{BIAS3}$, while the drains of the latter two are coupled to power supply conductor 22 operating at a positive potential such as $V_{DD}$. The cascode current sources 34-36 and 38-40, in combination with the cascode current mirrors 30-32 and 24-26, operate as a differential to single-ended converter for providing a voltage at the gate of transistor 44 (node 42) in response to the differential currents flowing through transistors 12 and 14. The drain of transistor 44 is coupled to the drain of transistor 46 at output node 48 and through frequency compensating capacitor 50 to the drain of transistor 26 at node 52. The source of transistor 44 is coupled to power supply conductor 28, and the source of transistor 46 is coupled to power supply conductor 22, while the gate of the latter is responsive to bias potential $V_{BIAS4}$. Capacitor 54 is coupled between the gate of transistor 44 and power supply conductor 28, and capacitor 56 is coupled between output node 48 and power supply conductor 28.

The operation of conventional op amp 10 proceeds as follows. Transistors 12 and 14 operate as a balanced differential pair responsive to the differential input signal applied at input terminals 16 and 18. Transistors 34-36 supply a first predetermined current flowing through the drain-source conduction paths of transistors 24 and 30 in response to bias potentials $V_{BIAS2}$ and $V_{BIAS3}$, respectively, and transistors 38-40 supply a second predetermined current flowing through transistors 26 and 32 for developing a balanced output signal at node 42. For an unbalanced differential input signal, for example when the signal applied at input terminal 18 exceeds that applied at input terminal 16, differential currents $\Delta I$ and $-\Delta I$ flow through the drain-source conduction paths of transistors 14 and 12, respectively, as shown in FIG. 1. The $-\Delta I$ differential current flowing into transistor 24 is mirrored through transistor 26 pulling a current of $-\Delta I$ from node 52, or alternately sourcing a current of $\Delta I$ into node 52. This adds with the $\Delta I$ differential current flowing through transistor 14 for a total differential current of $2\Delta I$ flowing into node 52 thereby increasing the potential at node 52 and likewise at node 42. The output signal at output node 48 falls as the gate drive of transistor 44 is increased. Alternately, if the differential input signal is switched such that the signal at input terminal 16 is greater than that applied at input terminal 18, node 52 sinks a differential current of $-2\Delta I$ causing the potential at nodes 52 and 42 to decrease which lessens the gate drive of transistor 44 and increases the output signal at output node 48. The high DC gain of op amp 10 is achieved in part by pumping the ±2ΔI differential currents through transistor 32 into the high impedance of node 42.

The minor compensation loop including transistors 32 and 44 and capacitor 50 is provided to stabilize the major compensation loop, the latter of which may comprise an impedance network (not shown) from an active filter application coupled between output node 48 and input terminals 16 and 18. It is important for all frequencies at which the gain is higher than 0 dB to have less than 360° of phase shift through the amplifier as previously explained. Accordingly, op amp 10 is internally frequency compensated by the classic pole-splitting capacitor 50 which loads output node 48 via node 52 and the drain-source conduction path of transistor 26. The value of capacitor 50 is increased by the well known Miller effect, wherein the effective value of capacitor 50 is equal to its component value times the gain of transistors 32 and 44, for creating a large dominant pole at a predetermined low frequency at node 52. The minor frequency compensating loop further includes transistors 32 and 44 and capacitor 54 for low-pass filtering the output signal of the differential to single-ended converter at high impedance node 42. For higher frequencies, the output impedance of transistor 44 is lowered due to the negative feedback loop through capacitor 50 whereby transistor 44 opposes changes in the load applied at output node 48. For example, any additional current drawn from output node 48 lowers the potential at the drain of transistor 44 which is fed back via capacitor 50 reducing the voltage at node 52 and likewise at node 42. The gate drive of transistor 44 is thus reduced allowing the drain voltage of transistor 44 to rise from the decreasing current flowing therethrough as transistor 46 supplies the additional current drawn through output node 48. Therefore, the feedback path through transistors 32, 44 and capacitor 50 reduces the output impedance of transistor 44 which lowers the RC time constant product at output node 48 and increases the frequency of the output pole. Accordingly, capacitor 50 is commonly known as a pole-splitting capacitor since it provides a low frequency dominate pole at node 52 and a high frequency pole at output node 48. The low frequency dominate pole is needed to roll-off the transfer function of op amp 10 such that the gain is less than 0 dB before the critical 360° of phase shift, yet the pole at output node 48 must be placed at a high frequency such that the 90° of phase shift associated therewith does not influence the phase response in the neighborhood of the unity gain frequency $\omega_u$ (0 dB crossing) of the gain response and adversely effect the overall stability.

Figure 2:
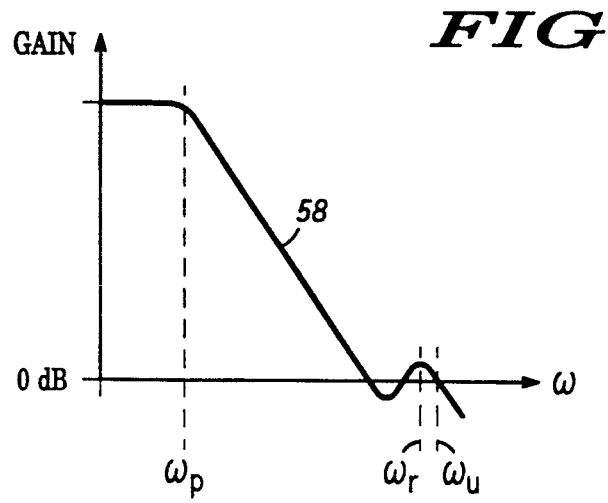
FIG. 2 is a Bode plot of the conventional compensation circuit for the operational amplifier.

The Bode plot shown in FIG. 2 illustrates the gain response versus radian frequency $\omega$ of the minor frequency compensation circuit of op amp 10. The unity gain frequency $\omega_u$ of op amp 10 is given as $g_{m12}/C_{50}$, say 10 MHz, with a frequency compensating dominate pole $\omega_p$ at one KHz, where $g_{m12}$ is the transconductance of transistor 12 and $C_{50}$ is the value of capacitor 50. One difficulty with the minor compensation loop of the prior art is the limitation on the gain-bandwidth product due to the single pole roll-off of its transfer function as shown in gain response plot 58 of FIG. 2, wherein the frequency of the dominate pole $\omega_p$ must remain relatively low to ensure adequate gain and phase margin. It is desirable to increase the frequency of the dominate pole $\omega_p$ and thereby increase the gain-bandwidth product. Unfortunately, such a move would also extend the unity gain frequency $\omega_u$ and reduce the phase margin and stability of op amp 10.

Another drawback of the minor frequency compensation circuit is that transistor 32 must be sized similar to transistor 44 to maintain a high impedance at node 42, that is, the transconductance ($g_m$) of transistor 32 must be made similar to the $g_m$ of transistor 44 which must be large to provide adequate output drive. The similarity between transistors 32 and 44 arises from the need to provide adequate dampening of the capacitor feedback circuit 50 such that node 42 remains a high impedance point; otherwise, the large peak occurring at the resonant frequency of the minor loop, such as shown at frequency $\omega_r$ of FIG. 2, could contribute to the major loop gain of op amp 10. This gain peaking is caused by a high Q-factor for the pole pair of capacitors 50 and 54 and may extend the unity gain frequency $\omega_u$ of the transfer function to a higher frequency and reduce the phase margin such that the gain is greater than one at the 360° phase shift of the phase response causing op amp 10 to oscillate.

The resonant frequency of the minor compensation circuit and the gain peaking associated therewith are difficult parameters to control over the manufacturing process variation. Therefore to reduce the peak gain occurring at the resonant frequency, it is necessary to provide a large geometry and high gain for transistor 32 to maintain a high impedance point at node 42. Moreover, due to the symmetry of the differential to single-ended converter formed of transistors 24–40, each must be sized large similar to transistor 32, thereby increasing the total physical area and power consumption of the amplifier. A more desirable situation would be to provide a large geometry for transistor 44 to drive the output loads, and yet maintain the size of transistors 24–40 relatively small.

DETAILED DESCRIPTION OF THE PREFERRED EMBODIMENT

Figure 3:
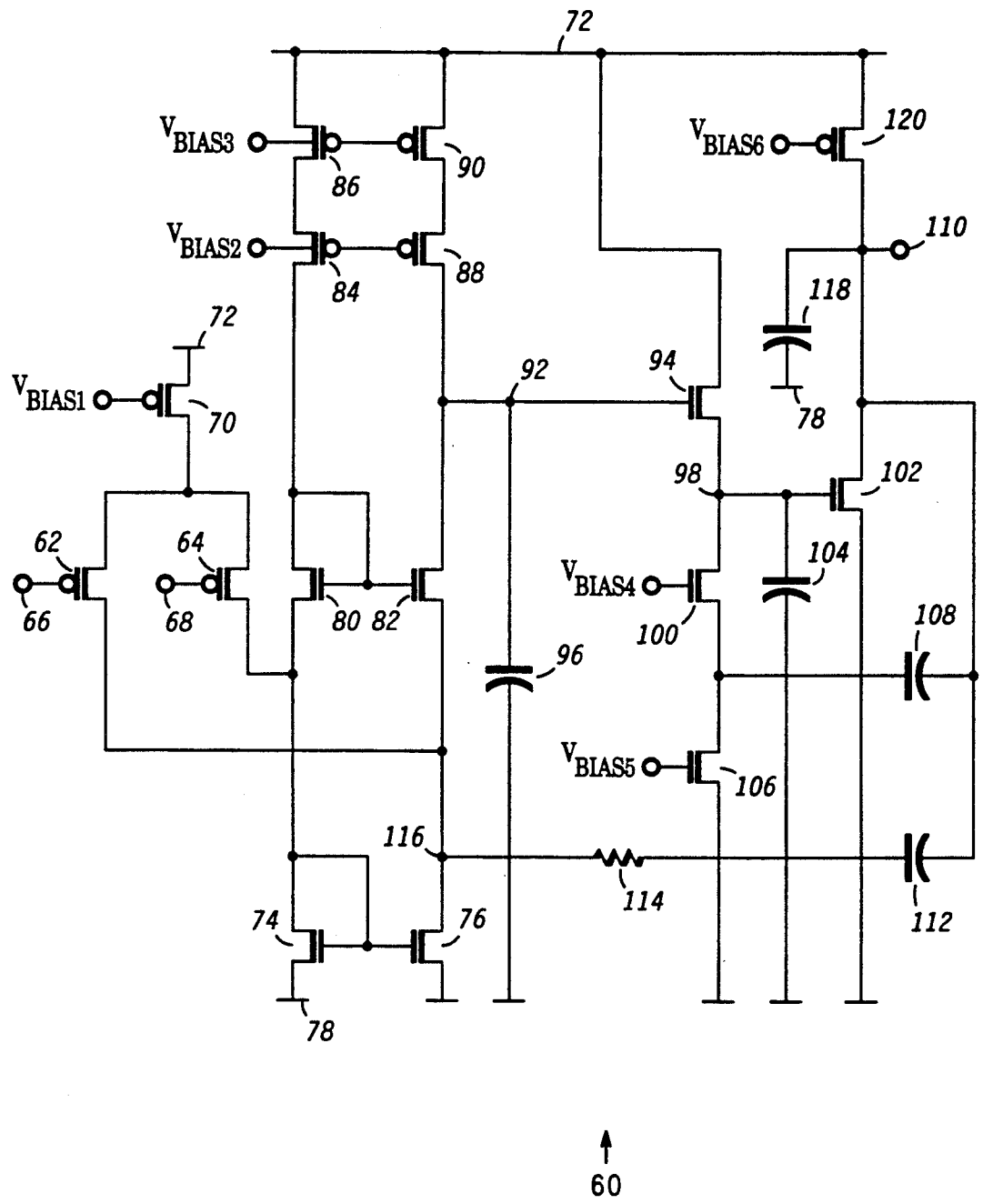
FIG. 3 is a schematic diagram illustrating the preferred embodiment of the present invention.

Referring to FIG. 3, there is shown op amp 60 of the present invention suitable for manufacturing in integrated circuit form using conventional integrated circuit processes. Op amp 60 includes balanced differential transistors 62 and 64 each having a gate coupled for receiving a differential input signal applied at input terminals 66 and 68, respectively, and a common source terminal coupled to the drain of transistor 70, the latter of which operates as a current supply with its source coupled to power supply conductor 72 and gate responsive to bias potential $V_{BIAS1}$. The sources of transistors 62 and 64 are respectively coupled to the input and output of a current mirror circuit formed of transistors 74 and 76 each having common gates and common sources coupled to power supply conductor 78 typically operating at ground potential. Transistors 80 and 82 form a second current mirror circuit cascoded with respect to current mirror transistors 74 and 76. The drain of transistor 80 is coupled to the common gates of transistors 80 and 82 and to the cascode current source transistors 84 and 86, while the drain of transistor 82 is coupled for receiving the current supplied by cascode current source transistors 88 and 90. Transistors 80 and 82 are cascoded with transistors 74 and 76 for providing a high impedance at node 92, that is the drain of transistor 82. The gates of transistors 84 and 88 are coupled for receiving bias potential $V_{BIAS2}$, and the gates of transistors 86 and 90 are coupled for receiving bias potential $V_{BIAS3}$, while the drains of the latter two are coupled to power supply conductor 72 operating at a positive potential such as $V_{DD}$. The cascode current source transistors 84-86 and 88-90, in combination with the cascode current mirrors 80-82 and 74-76, operate as a differential to single-ended converter for providing a voltage at node 92 in response to the differential currents flowing through transistors 62 and 64.

The present invention includes the aforedescribed transistors 62-90 constructed and operating similarly as disclosed for transistors 12-40 of FIG. 1, and further includes an improved frequency compensating output stage comprising transistor 94 having a drain coupled to power supply conductor 72, a source at node 98, and a gate coupled to node 92 and through capacitor 96 to power supply conductor 78. Node 98 is also coupled to the drain of transistor 100, to the gate of transistor 102 and through capacitor 104 to power supply conductor 78. The gate of transistor 100 is coupled for receiving bias potential $V_{BIAS4}$, while the source of the same is coupled to the drain of transistor 106 and through capacitor 108 to output node 110, that is the drain of transistor 102. The gate of transistor 106 is coupled for receiving bias potential $V_{BIAS5}$, and its source is coupled together with the source of transistor 102 to power supply conductor 78, while the drain of transistor 102 is coupled through capacitor 112 and resistor 114 to the drain of transistor 76 at node 116. The drain of transistor 102 is also coupled through capacitor 118 to power supply conductor 78 and to the source of transistor 120, while the gate of transistor 120 is coupled for receiving bias potential $V_{BIAS6}$, and the drain of the same is coupled to power supply conductor 72. The output signal of op amp 60 is provided at output node 110.

The differential input stage of op amp 60, comprising transistors 62, 64 and 70, and the differential to single-ended converter including transistors 74-90 operate much as described for transistors 12-40 of FIG. 1. Briefly, transistors 62 and 64 operate as a balanced differential pair responsive to a differential input signal applied at input terminals 66 and 68. Transistors 84-86 supply a first predetermined current flowing through the drain-source conduction paths of transistors 74 and 80 in response to bias potentials $V_{BIAS2}$ and $V_{BIAS3}$, respectively, and transistors 88-90 supply a second predetermined current flowing through transistors 76 and 82 for developing a balanced output signal at node 92. For a unbalanced differential input signal, differential currents $\pm 2\Delta I$ flow through transistors 76 and 74 and raise and lower the potential at nodes 116 and 92. The potential at node 98 follows that at node 92 because of the source-follower configuration of transistor 94. The potential at node 98 drives transistor 102 conducting more or less current through transistors 120 and 102 causing the potential at output node 110 to change in an opposite manner with respect to the potential at node 92.

The principal improvement over the prior art shown in FIG. 1 is contained in the minor compensation circuit between nodes 92 and 110 including a first compensation circuit comprising capacitor 112 and resistor 114 and transistors 82, 94 and 102. Capacitor 112 operates as a pole-splitting capacitor for providing a dominate pole of predetermined frequency at node 116 to roll-off the transfer function of op amp 60, and a high frequency pole at output node 110 such that the 90° of phase shift associated therewith does not influence the phase response in the neighborhood of the unity gain frequency and adversely effect the overall stability. In addition, amplifier 60 includes a second compensation circuit comprising capacitor 108 and transistors 100 and 102. The second compensation circuit is provided to dampen the overall response of the first compensation circuit and suppress the large peak gain occurring at the resonant frequency thereof.

Figure 4:
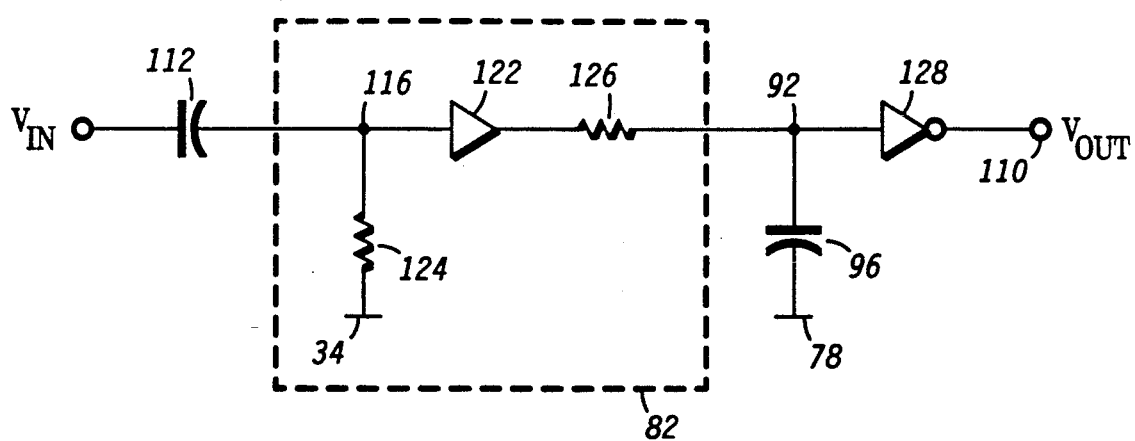
FIG. 4 is a schematic diagram illustrating an equivalent circuit of the first and second compensation circuits for open loop analysis.

The effect of the first and second compensation circuits may best be understood through an open loop analysis of its first order equivalent circuit as shown in FIG. 4, wherein the loop is cut at output node 110 thereby leaving capacitor 112 in series with the equivalent circuit of transistor 82 which includes amplifier 122 representing the gain of transistor 82 and resistors 124 and 126 as the transconductance and output impedance thereof, respectively. Components having a similar function are given the same reference number used in FIG. 3. The output of the equivalent circuit of transistor 82 (node 92) is coupled through capacitor 96 to power supply conductor 78 and through amplifier 128 to output node 110, wherein amplifier 128 represents the transfer function between nodes 92 and 110. Resistor 114 of FIG. 3 is momentarily omitted to simplify the analysis. The values of both capacitors 108 and 112 are effectively increased via the Miller effect through the amplification of transistors 82, 94 and 102 and transistors 100 and 102, respectively, while capacitors 96 and 118 help stabilize the first compensation circuit. It can be shown that the open loop transfer function F(s) of the equivalent circuit shown in FIG. 4 may be given as:

$$F(s) = \frac{V_{out}(s)}{V_{in}(s)} \approx \left(\frac{C_{112}}{g_{dc}}\right)\left(\frac{s}{1 + \frac{C_{96}}{g_{dc}}s}\right)\left(\frac{1}{1 + \frac{C_{112}}{g_{m82}}s}\right)A_{v128}(s) \quad (1)$$

where:

"s" is the complex Laplace transform variable $V_{in}(s)$ is the input voltage of the open loop in terms of "s"

$V_{out}(s)$ is the output voltage of the open loop in terms of "s"

$C_{112}$ is the value of capacitor 112

$g_{dc}$ is the output conductance of transistor 82 of value $1/R_{126}$ $C_{96}$ is the value of capacitor 96

$g_{m82}$ is the transconductance of transistor 82 of value $1/R_{124}$ $A_{v128}(s)$ is the complex transfer function of amplifier 128 between nodes 92 and 110

It can further be shown that the complex response of amplifier 128 may be formulated as follows:

$$A_{V128}(s) \approx A_{V128}(0) \left( \frac{1 + \frac{C_{108}}{g_{m100}} s}{1 + \frac{C_{108}}{g_{m94}} A_{V128}(0)s} \right) \left( \frac{1}{1 + \frac{C_{104}}{g_{m102}} s} \right) \left( \frac{1}{1 + \frac{C_{118}}{g_{m102}} s} \right) \quad (2)$$

where:
$A_{V128}(0)$ is the DC gain of amplifier 128
$C_{108}$ is the value of capacitor 108
$C_{104}$ is the value of capacitor 104
$C_{118}$ is the value of capacitor 118
$g_{m94}$ is the transconductance of transistor 94
$g_{m100}$ is the transconductance of transistor 100
$g_{m102}$ is the transconductance of transistor 102

Thus, equation (2) yields $A_{V128}(s)$ approximately equal to the DC term $A_{V128}(0)$ multiplied by the ratio of a zero $$\left( 1 + \frac{C_{108}}{g_{m100}} s \right)$$

and a pole $$\left( 1 + \frac{C_{108}}{g_{m94}} A_{V128}(0)s \right),$$

with some additional higher frequency poles $$\left( 1 + \frac{C_{104}}{g_{m102}} s \right) \text{and} \left( 1 + \frac{C_{118}}{g_{m102}} s \right).$$

Figure 5:
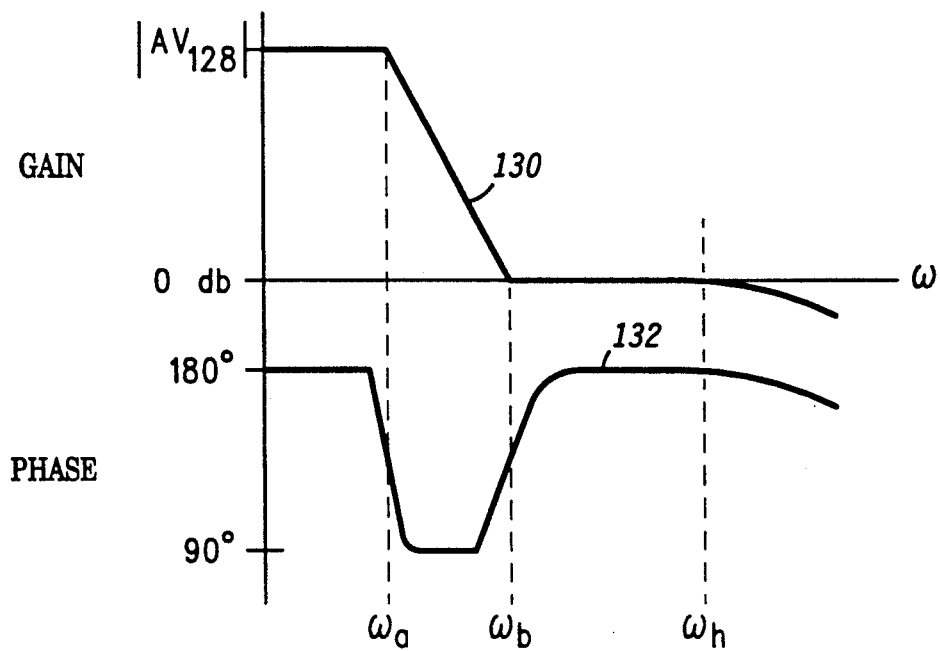
FIG. 5 is a gain and phase plot of the second compensation circuit.

Consider first just the plot of the gain and phase response of equation (2) under the assumption that $g_{m94}$ is equal to $g_{m100}$. The combination of the transconductance of transistor 94 and capacitor 108 loads node 98 creating a dominate pole at frequency $\omega_a = g_{m94}/A_{V128}(0)C_{108}$ as capacitor 108 operates as a pole-splitting capacitor. A typical frequency for $\omega_a$ is one MHz. At frequencies between $\omega_a$ and $\omega_b$, the gain response 130 falls at 6 dB/octave due to the first order pole from capacitor 108 until frequency $\omega_b = g_{m100}/C_{108}$, where the reactance of capacitor 108 becomes very low approaching a short circuit thereby removing the effect from the dominate pole at frequency $\omega_a$ and adding a zero to the overall transfer function which levels the gain off at 0 dB ($g_{m94}=g_{m100}$). Other higher frequency non-dominate poles begin to influence the overall response at some high frequency $\omega_h$ as shown in the Bode plot of FIG. 5. One important feature of the Bode plot of FIG. 5 is the phase response wherein the pole at frequency $\omega_a$ inserts a $-90°$ phase shift from 180° while the zero at frequency $\omega_b$ inserts a $+90°$ phase shift, returning phase response plot 132 to 180° until frequency $\omega_h$ where is again falls from the high frequency non-dominate poles. This increase in the phase response may be used advantageously in the gain and phase response of the composite first and second compensation circuits as will be shown.

Figure 6:
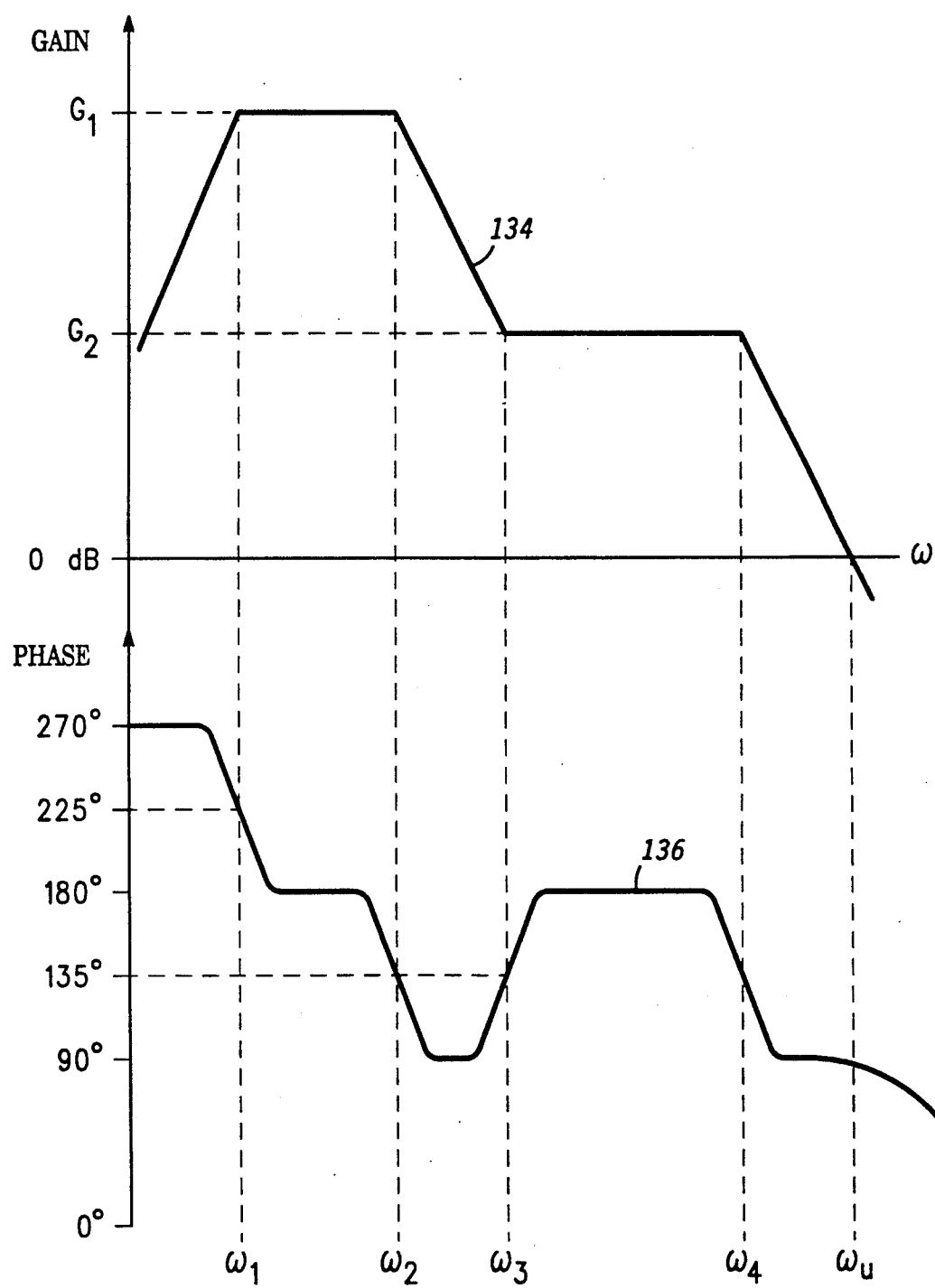
FIG. 6 is a gain and phase plot of the composite first and second compensation circuits.

The gain and phase response plots 134 and 136 of the composite first and second compensation circuits are shown in the Bode plot of FIG. 6 illustrating the desired open loop response of op amp 60. With the first compensation loop cut at output node 110, capacitor 112 introduces a zero since it is serially coupled between nodes 110 and 116. The dominate pole for the equivalent open loop circuit of FIG. 4 is then provided by capacitor 96. The expression for F(s) from equation (1) yields the DC term $C_{112}/g_{dc}$ multiplied by the ratio of a zero(s) and a pole $$\left( 1 + \frac{C_{96}}{g_{dc}} s \right)$$

and further includes a pole $$\left( 1 + \frac{C_{112}}{g_{m82}} s \right)$$

and the poles and zero of $A_{V128}(s)$ as described from equation (2). At zero frequency, the feedback path via capacitor 112 is an open circuit corresponding to zero gain ($-$infinite dB). The gain response plot 134 increases due to the increasing gain provided by the transconductance of transistor 82 ($g_{m82}$) and capacitor 112 until reaching frequency $\omega_1=g_{dc}/C_{96}$ with a gain $G_1$ of $C_{112}A_{V128}(0)/C_{96}$. A typical value for frequency $\omega_1$ is one kHz with the value of capacitor 112 selected at 2 picofarads, capacitor 96 at 0.3 picofarads and resistor 114 approximately 100 ohms. At frequency $\omega_1$, capacitor 96 loads the high impedance node 92 thereby cancelling the zero (s) and provides the flat response between frequencies $\omega_1$ and $\omega_2$ for the gain response plot 134. The phase response plot 136 begins at 270° due to zero (s) and falls to 180° with the pole $$\left( 1 + \frac{C_{96}}{g_{dc}} s \right)$$

passing through 225° at frequency $\omega_1$.

The Miller-enchanced capacitor 108 and the current buffer through transistors 100 and 106 loading the source-follower configured transistor 94 takes effect by providing a pole at frequency $\omega_2=g_{m94}/A_{V128}(0)C_{108}$ reducing the gain response plot 134 at 6 dB/octave between frequencies $\omega_2$ and $\omega_3$ as shown in FIG. 6, corresponding to the frequencies $\omega_a$ and $\omega_b$ of the gain response plot 130 of FIG. 5. A typical value for frequency $\omega_2$ is one MHz with the value of capacitor 108 selected at 4 picofarads. The phase response plot 136 undergoes another $-90°$ phase shift from capacitor 108 passing through 135° at frequency $\omega_2$. Capacitor 108 approaches a short circuit at frequency $\omega_3=g_{m100}/C_{108}$ removing the effect of the pole at frequency $\omega_2$, whereby the gain response plot 134 levels off at gain $G_2=C_{112}*g_{m94}/C_{96}*g_{m100}$ and phase response plot 136 returns to 180° with a positive phase shift of $+90°$, again passing through 135° at frequency $\omega_3$.

The zero(s) effect from series capacitor 112 is removed at frequency $\omega_4=g_{m82}/C_{112}$ as it approaches a short circuit, again allowing the gain response plot 134 to again fall at 6 dB/octave. In addition, phase response plot 136 undergoes $-90°$ phase shift passing through 135° at frequency $\omega_4$. The gain response plot 134 crosses 0 dB at unity gain frequency $\omega_u = g_{m82} * g_{m94} / C_{96} * g_{m100}$ corresponding to a phase margin of approximately 75° in the present example, well above 360° critical phase shift, while the gain margin is approximately 11 dB. Notably, the critical frequency $\omega_u$ is given as the ratio of transconductances $g_{m82}$, $g_{m94}$ and $g_{m100}$ which are typically easy process parameters to control and match during manufacturing.

Thus, one of the principal advantages of the second compensation circuit is the positive phase shift occurring at frequency $\omega_3$, effectively providing additional phase margin for the overall transfer function of op amp 60. The frequency of the dominate pole may be increased over the prior art by at least the differential frequency $\omega_4 - \omega_2$ since the present invention provides the positive phase shift over that frequency range (90° to 180° between $\omega_2$ and $\omega_4$) which extends the phase margin and the gain margin for maintaining the stability of op amp 60 while the higher frequency of the dominate pole of the first compensation circuit increases the gain-bandwidth product. When the major feedback loop is closed by an external impedance network, the gain-bandwidth product can reach 200 MHz.

Hence, what has been described is a novel compensation circuit for an op amp including first and second compensation circuits, wherein the gain and phase response of the second compensation loop inserts a positive phase shift in the overall transfer function of the op amp allowing the dominant pole of the first compensation circuit to be extended thereby increasing the gain-bandwidth product while ensuring stability over the operational bandwidth of the op amp.

I claim:

1. An amplifier having first and second inputs coupled for receiving a differential input signal and having an output for providing an output signal inverted with respect to the differential input signal, comprising:
   an input stage responsive to the differential input signal and having first and second outputs for conducting first and second differential currents;
   first means having first and second inputs coupled for receiving said first and second differential currents and providing an output signal at a first node, said first node being separated from said first input of said first means by a high impedance; and
   an output stage coupled between said first node and the output of the amplifier, said output stage including,
   (a) a first transistor having a drain, a gate and a source, said drain being coupled to the output of the amplifier, said source being coupled to a first source of operating potential, said gate being coupled for receiving said output signal of said first means provided at said first node,
   (b) a first compensation circuit coupled between the output of the amplifier and said first input of said first means for establishing a first pole in the transfer function of the amplifier at a first predetermined frequency, and
   (c) a second compensation circuit coupled between the output of the amplifier and said gate of said first transistor for establishing a second pole and a zero in the transfer function of the amplifier at second and third predetermined frequencies for inserting a positive phase shift about said third predetermined frequency which increases the phase margin of the amplifier.

2. The amplifier of claim 1 wherein said second compensation circuit includes:
   a second transistor having a drain, a gate and a source, said source being coupled to said first source of operating potential, said gate being coupled for receiving a first bias potential;
   a third transistor having a drain, a gate and a source, said drain being coupled to said gate of said first transistor, said source being coupled to said drain of said second transistor, said gate being coupled for receiving a second bias potential; and
   a first capacitor coupled between the output of the amplifier and said source of said third transistor.

3. The amplifier of claim 2 wherein said second compensation circuit further includes a second capacitor coupled between said gate of said first transistor and said first source of operating potential.

4. The amplifier of claim 3 wherein said first compensation circuit includes:
   a third capacitor coupled between the output of the amplifier and said first input of said first means; and
   a fourth capacitor coupled between said first node and said first source of operating potential.

5. The amplifier of claim 4 wherein said output stage further includes:
   a fourth transistor having a drain, a gate and a source, said gate being coupled to said first node, said drain being coupled to a second source of operating potential, said source being coupled to said gate of said first transistor;
   first current supply means having an output for providing a predetermined current to said drain of said first transistor; and
   a fifth capacitor coupled between said drain of said first transistor and said first source of operating potential.

6. The amplifier of claim 5 wherein said input stage includes:
   a fifth transistor having a drain, a gate and a source, said source being coupled to said second source of operating potential, said gate being coupled for receiving a third bias potential;
   a sixth transistor having a drain, a gate and a source, said source being coupled to said drain of said fifth transistor, said drain being coupled to said first input of said first means; and
   a seventh transistor having a drain, a gate and a source, said source being coupled to said drain of said fifth transistor, said drain being coupled to said second input of said first means, said gates of said sixth and seventh transistors being coupled for receiving the differential input signal.

7. The amplifier of claim 6 wherein said first means includes:
   second current supply means having first and second outputs for providing first and second currents of predetermined magnitudes;
   an eighth transistor having a drain, a gate and a source, said drain being coupled to said first output of said second current supply means, said source being coupled to said drain of said seventh transistor, said gate and drain being coupled together;
   a ninth transistor having a drain, a gate and a source, said drain being coupled to said second output of said second current supply means at said first node, said source being coupled to said drain of said sixth transistor, said gate being coupled to said gate of said eighth transistor;

a tenth transistor having a drain, a gate and a source, said drain being coupled to said source of said eighth transistor, said source being coupled to said first source of operating potential, said gate and drain being coupled together; and an eleventh transistor having a drain, a gate and a source, said drain being coupled to said source of said ninth transistor, said source being coupled to said first source of operating potential, said gate being coupled to said gate of said tenth transistor.

8. The amplifier of claim 7 wherein said second current supply includes:

a twelfth transistor having a drain, a gate and a source, said source being coupled to said second source of operating potential, said gate being coupled for receiving a fourth bias potential;

a thirteenth transistor having a drain, a gate and a source, said source being coupled to said second source of operating potential, said gate being coupled for receiving said fourth bias potential;

a fourteenth transistor having a drain, a gate and a source, said source being coupled to said drain of said twelfth transistor, said gate being coupled for receiving a fifth bias potential, said drain being coupled to said drain of said eighth transistor; and a fifteenth transistor having a drain, a gate and a source, said source being coupled to said drain of said thirteenth transistor, said gate being coupled for receiving said fifth bias potential, said drain being coupled to said drain of said ninth transistor at said first node.

9. In an operational amplifier an input stage responsive to a differential input signal for providing first and second differential currents flowing into first and second inputs of a differential to single-ended converter for providing an output signal at a first node, and an output stage coupled between the first node and the output of the operational amplifier, said output stage comprising:

a first compensation circuit coupled between the output of the operational amplifier and the first input of the differential to single-ended converter for establishing a first pole in the transfer function of the operational amplifier at a first predetermined frequency;

a first transistor having a drain, a gate and a source, said drain being coupled to the output of the operational amplifier, said source being coupled to a first source of operating potential, said gate being coupled for receiving the output signal of the differential to single-ended converter;

a second transistor having a drain, a gate and a source, said source being coupled to said first source of operating potential, said gate being coupled for receiving a first bias potential;

a third transistor having a drain, a gate and a source, said drain being coupled to said gate of said first transistor, said source being coupled to said drain of said second transistor, said gate being coupled for receiving a second bias potential; and a first capacitor coupled between the output of the operational amplifier and said source of said third transistor for establishing a second pole and a zero in the transfer function of the operational amplifier at second and third predetermined frequencies for inserting a positive phase shift about said third predetermined frequency which increases the phase margin of the operational amplifier.

10. The operational amplifier of claim 9 wherein said first compensation circuit includes:

a second capacitor coupled between the output of the operational amplifier and the first input of the differential to single-ended converter; and a third capacitor coupled between the first node and said first source of operating potential.

11. The operational amplifier of claim 10 wherein said output stage further includes:

a fourth capacitor coupled between said gate of said first transistor and said first source of operating potential;

a fourth transistor having a drain, a gate and a source, said gate being coupled to the first node, said drain being coupled to a second source of operating potential, said source being coupled to said gate of said first transistor;

first current supply means having an output for providing a predetermined current to said drain of said first transistor; and a fifth capacitor coupled between said drain of said first transistor and said first source of operating potential.

12. The operational amplifier of claim 11 wherein the input stage includes:

a fifth transistor having a drain, a gate and a source, said source being coupled to said second source of operating potential, said gate being coupled for receiving a third bias potential;

a sixth transistor having a drain, a gate and a source, said source being coupled to said drain of said fifth transistor, said drain being coupled to the first input of the differential to single-ended converter; and a seventh transistor having a drain, a gate and a source, said source being coupled to said drain of said fifth transistor, said drain being coupled to the second input of the differential to single-ended converter, said gates of said sixth and seventh transistors being coupled for receiving the differential input signal.

13. The operational amplifier of claim 12 wherein the differential to single-ended converter includes:

second current supply means having first and second outputs for providing first and second currents of predetermined magnitudes;

an eighth transistor having a drain, a gate and a source, said drain being coupled to said first output of said second current supply means, said source being coupled to said drain of said seventh transistor, said gate and drain being coupled together;

a ninth transistor having a drain, a gate and a source, said drain being coupled to said second output of said second current supply means at said first node, said source being coupled to said drain of said sixth transistor, said gate being coupled to said gate of said eighth transistor;

a tenth transistor having a drain, a gate and a source, said drain being coupled to said source of said eighth transistor, said source being coupled to said first source of operating potential, said gate and drain being coupled together; and an eleventh transistor having a drain, a gate and a source, said drain being coupled to said source of said ninth transistor, said source being coupled to said first source of operating potential, said gate being coupled to said gate of said tenth transistor.

14. The amplifier of claim 13 wherein said second current supply includes:
- a twelfth transistor having a drain, a gate and a source, said source being coupled to said second source of operating potential, said gate being coupled for receiving a fourth bias potential;
- a thirteenth transistor having a drain, a gate and a source, said source being coupled to said second source of operating potential, said gate being coupled for receiving said fourth bias potential;
- a fourteenth transistor having a drain, a gate and a source, said source being coupled to said drain of said twelfth transistor, said gate being coupled for receiving a fifth bias potential, said drain being coupled to said drain of said eighth transistor; and
- a fifteenth transistor having a drain, a gate and a source, said source being coupled to said drain of said thirteenth transistor, said gate being coupled for receiving said fifth bias potential, said drain being coupled to said drain of said ninth transistor at the first node.

15. An integrated operational amplifier having first and second inputs coupled for receiving a differential input signal and having an output for providing an output signal inverted with respect to the differential input signal, comprising:
- an input stage responsive to the differential input signal and having first and second outputs for conducting first and second differential currents;
- first means having first and second inputs coupled for receiving said first and second differential currents and providing an output signal at a first node, said first node being separated from said first input of said first means by a high impedance; and
- an output stage coupled between said first node and the output of the operational amplifier, said output stage including,
  (a) a first transistor having a drain, a gate and a source, said drain being coupled to the output of the operational amplifier, said source being coupled to a first source of operating potential, said gate being coupled for receiving said output signal of said first means provided at said first node,
  (b) a first compensation circuit coupled between the output of the operational amplifier and said first input of said first means for establishing a first pole in the transfer function of the operational amplifier at a first predetermined frequency, and
  (c) a second compensation circuit coupled between the output of the operational amplifier and said gate of said first transistor for establishing a second pole and a zero in the transfer function of the operational amplifier at second and third predetermined frequencies for inserting a positive phase shift about said third predetermined frequency which increase the phase margin of the operational amplifier.

16. The operational amplifier of claim 15 wherein said second compensation circuit includes:
- a second transistor having a drain, a gate and a source, said source being coupled to said first source of operating potential, said gate being coupled for receiving a first bias potential;
- a third transistor having a drain, a gate and a source, said drain being coupled to said gate of said first transistor, said source being coupled to said drain of said second transistor, said gate being coupled for receiving a second bias potential; and
- a first capacitor coupled between the output of the operational amplifier and said source of said third transistor.

17. The operational amplifier of claim 16 wherein said first compensation circuit includes:
- a second capacitor coupled between the output of the operational amplifier and said first input of said differential to single-ended converter;
- a third capacitor coupled between said first node and said first source of operating potential; and
- a first resistor coupled in series with said third capacitor.

18. The operational amplifier of claim 17 wherein said output stage further includes:
- a fourth capacitor coupled between said gate of said first transistor and said first source of operating potential;
- a fourth transistor having a drain, a gate and a source, said gate being coupled to said first node, said drain being coupled to a second source of operating potential, said source being coupled to said gate of said first transistor;
- first current supply means having an output for providing a predetermined current to said drain of said first transistor; and
- a fifth capacitor coupled between said drain of said first transistor and said first source of operating potential.

19. The operational amplifier of claim 18 wherein said input stage includes:
- a fifth transistor having a drain, a gate and a source, said source being coupled to said second source of operating potential, said gate being coupled for receiving a third bias potential;
- a sixth transistor having a drain, a gate and a source, said source being coupled to said drain of said fifth transistor, said drain being coupled to said first input of said differential to single-ended converter; and
- a seventh transistor having a drain, a gate and a source, said source being coupled to said drain of said fifth transistor, said drain being coupled to said second input of said differential to single-ended converter, said gates of said sixth and seventh transistors being coupled for receiving the differential input signal.

20. A method of stabilizing an operational amplifier, comprising the steps of:
- receiving a differential input signal;
- converting said differential input signal to an output signal at a first node;
- applying said output signal provided at said first node to the gate of a first transistor for providing an inverted output signal of the operational amplifier at the drain thereof;
- establishing a first pole in the transfer function of the operational amplifier at a first predetermined frequency to decrease the magnitude of said inverted output signal of the operational amplifier with increasing frequency; and
- establishing a second pole and a zero in the transfer function of the operational amplifier at second and third predetermined frequencies respectively for inserting a positive phase shift about said third predetermined frequency which allows the first predetermined frequency to be increased without extending the unity gain frequency of the operational amplifier above the frequency corresponding to a 360 degree phase shift through the operational amplifier.

* * * * *